United States Patent [19]

Zakhor et al.

[11] Patent Number: 4,982,162

[45] Date of Patent: Jan. 1, 1991

[54] METHOD FOR RECONSTRUCTING MRI SIGNALS RESULTING FROM TIME-VARYING GRADIENTS

[75] Inventors: Avideh Zakhor, Encino, Calif.; Richard R. Rzedzian, Lexington, Mass.

[73] Assignee: Advanced NMR Systems, Inc., Woburn, Mass.

[21] Appl. No.: 379,955

[22] Filed: Jul. 14, 1989

[51] Int. Cl.$^5$ ............................................. G01R 33/54
[52] U.S. Cl. .................................................. 324/312
[58] Field of Search ...................... 324/309, 312, 307; 364/413.13

[56] References Cited

U.S. PATENT DOCUMENTS

| | | | |
|---|---|---|---|
| 4,315,216 | 2/1982 | Clow et al. | 324/309 |
| 4,639,671 | 1/1987 | Macovski | 324/309 |
| 4,740,750 | 4/1988 | Machida | 324/309 |

OTHER PUBLICATIONS

Maeda et al., "Reconstruction by Weighted Correlation for MRI . . .", IEEE Transactions on Medical Imaging, vol. 7, No. 1, Mar. 1988.

Primary Examiner—Michael J. Tokar
Assistant Examiner—Kevin D. O'Shea
Attorney, Agent, or Firm—Ostrolenk, Faber, Gerb and Soffen

[57] ABSTRACT

A method to recover MRI signals resulting from the application of time varying gradients. The raw MRI signal is demodulated, low pass filtered, and digitized using an A/D converter sampling linearly at the Nyquist rate. The samples from the A/D converter are compiled into a vector, which is multiplied by a least squares estimator matrix $(H^*H)^{-}H^*$, where H is a matrix whose mkth element, in the case of a sinusoidal gradient, is given by $h_{mk} = e^{-j\pi}$ $$h_{mk} = e^{-j\pi(k-\frac{N}{2})\cos(\frac{\pi m}{PN})}$$

This multiplication is repeated for each vector of samples from the A/D converter, and the vectors resulting from the multiplication are accumulated to form the columns of a matrix, the rows of which are Fourier transformed to obtain the MRI image.

4 Claims, 3 Drawing Sheets

METHOD FOR RECONSTRUCTING MRI SIGNALS RESULTING FROM TIME-VARYING GRADIENTS

BACKGROUND OF THE INVENTION

1. Field of the Invention:

The present invention relates to magnetic resonance imaging (MRI) techniques and, more particularly, to a technique for recovering MRI signals resulting from the application of time varying gradients.

2. Description of the Related Art:

Primary among the factors currently limiting the rate of growth of MRI in the diagnostic imaging marketplace are concerns relating to its limited applicability to the study of organ systems subject to significant involuntary physiological motion, especially of the heart. This problem can be alleviated by decreasing data acquisition time. By reducing the total scan time to a small fraction of the cardiac period, motion artifacts due to all physiological motions including that of the heart, are avoided.

In an effort to reduce data acquisition time, MRI methods using time-varying gradients have been developed. See, for example, U.S. Pat. No. 4,740,748. In this patent, orthogonal sinusoidal gradient fields are modulated during the observation of a free induction decay (FID) signal to scan the spatial frequency domain (hereinafter referred to as "k-space") and efficiently collect the data necessary for image reconstruction. Since data acquisition occurs during a single FID, imaging occurs in less than 100 milliseconds, thus overcoming problems such as motion artifacts discussed above.

The actual MRI image is generated by performing a two-dimensional Fourier transform of the data acquired from the transversal through k-space effected by the time-varying gradients However, if the sampling of k-space is to be linear, the data acquired must necessarily be sampled non-linearly because of the time-variance of the gradients. In order to obtain linear data, non-linear sampling techniques can be employed, but such sampling is quite difficult to implement and must be modified wherever the waveform of the gradient is changed.

As an alternative, researchers have turned reconstruction techniques which employ postfiltering of observed FID signals. See, e.g., A. Maeda, "Reconstruction by Weighted Correlation for MRI with Time-Varying Gradients", *IEEE Transactions of Medical Imaging*, Vol 7, No. 1 pp. 26–31 (March 1988). The technique disclosed in this paper estimates spin density by calculating the "weighted" correlation of the observed FID signal and the phase modulation function at each point.

The present invention is similarly directed to a technique for reconstructing images by appropriate filtering of data acquired during linear sampling of k-space. Accordingly, the primary object of the present invention is to provide an optimum filter for processing MRI signals resulting from time varying gradients, specifically sinusoidal gradients.

SUMMARY OF THE INVENTION

The present invention achieves the foregoing objective by a method in which the acquired data is converted into digital form and digitally processed with a novel least squares estimator weighting matrix prior to Fourier transformation.

More specifically, in accordance with the method of the present invention the acquired magnetic resonance data is demodulated, low pass filtered, converted to digital form, multiplied by the least squares estimator matrix, and finally Fourier transformed to recover the actual image.

In the case of a sinusoidal gradient, the least squares estimator utilized in the invention is given by $$B = (H^* H)^{-1} H^* r$$

where H is a $PN \times N$ matrix whose mkth element is given by:

$$h_{mk} = e^{-j\pi(k - \frac{N}{2})\cos(\frac{\pi m}{PN})}$$

where

PN = the total number of spatial samples; and
N = the number of spatial samples in the per line in k-space.

Although the H matrix set forth above is based upon a sinusoidal readout gradient, the method of the present invention can be used for deriving the H matrix for a readout gradient of any shape to obtain an optimal filter for that waveform.

BRIEF DESCRIPTION OF THE DRAWINGS

These and other features and advantages of the invention will become apparent from the following detailed description, when read in conjunction with the accompanying drawings, in which.

DETAILED DESCRIPTION OF THE OF THE PREFERRED EMBODIMENT

Figure 1:
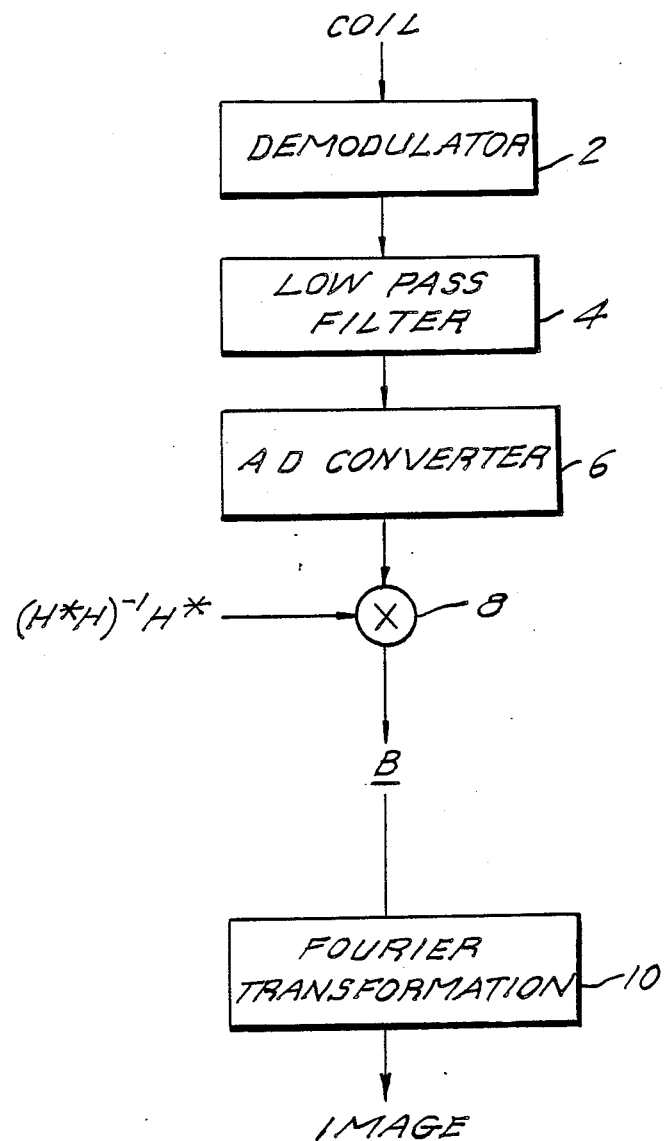
FIG. 1 is a block diagram of the overall method of the present invention.

Referring to FIG. 1, the raw signal from the imaging coil is first demodulated by demodulator 2 to yield a continuous time signal r(t), which constitutes the clean MRI signal s(t)+white noise n(t). Continuous time signal r(t) is then sent through a low pass filter 4, which has a sufficiently large cut-off frequency W to leave the clean MRI signal s(t) unchanged. The resultant filtered signal r(t) is next converted into digital form via A/D converter 6, which samples at the Nyquist rate of T/PN.

Every PN samples from A/D converter 6 fill up one $PN \times$ vector r. In step 8, the linear least squares estimator B is obtained by multiplying the vector r by the factor $(H^*H)^{-1}H^*$, where H is a $PN \times N$ matrix whose mkth element, in the case of a sinusoidal gradient, is given by:

$$h_{mk} = e^{-j\pi(k - \frac{N}{2})\cos(\frac{\pi m}{PN})}$$

Assuming that the number of samples PN=128, the B vector has a dimension of $128 \times 1$. To obtain the actual MRI image, 128 B vectors are accumulated to form the columns of a 128×128 matrix, and a Fourier transform is performed on the rows of this matrix (step 10).

The derivation of the novel weighting matrix B will now be described in detail.

Consider an object with extent [O,$L_x$] in the x direction and ]O,$L_y$[ in the y direction. If an exciting RF pulse with center at time t=0 is applied to the object at the same time as x and y gradients are on, the resulting NMR signal for t>0 is given by:

$$s(t) = \int_0^{L_x} \int_0^{L_y} e^{-\frac{t}{T2}} f(x,y) e^{-j2\pi(K_x(t)x + K_y(t)y)} \, dx\,dy \quad (1)$$

where $T_2$ is the spin-spin relaxation time, f(x,y) is the density distribution, and $K_x(t)$ and $K_y(t)$ are the integral of x and y gradients, $G_x(t)$ and $G_y(t)$ respectively. That is, $$K_x(t) = \gamma \int_{-\infty}^{t} G_x(\tau) d\tau, \, 0 < t < T \quad (2)$$

$$= \gamma \int_0^t G_x(\tau) d\tau + K_x(o), \, 0 < t < T$$

where T is the duration of the gradient pulse. Similarly, $$K_y(t) = \gamma \int_{-\infty}^{t} G_y(\tau) d\tau, \, 0 < t < T \quad (3)$$

$$= \gamma \int_0^t G_y(\tau) d\tau + K_y(o), \, 0 < t < T$$

Since only the signal from t=0 to t=T is observed, and $T_2 >> t$, the $e^{-t/T2}$ term can be dropped from equation (1). Also, since the spatial images are interpreted as being centered in k-space, the image is non-zero only for $-L_x/2 < x < L_x/2$ and $-L_y/2 < y < L_y/2$.

$$s(t) = \int_{-L_x/2}^{L_x/2} \int_{-L_y/2}^{L_y/2} f(x,y) e^{-j\pi(K_x(t)x + K_y(t)y)} \, dx\,dy \quad (4)$$

Furthermore, since k-space is being filled row by row (or equivalently column by column), it can be assumed that, from t=0 to t=T, $K_x(t)$ is held constant as a function of time, or equivalently $G_x(t)$ is zero. (Note that herein the variable "x" represents location along the vertical axis and the variable "y" represents location along the horizontal axis, which is reversed from standard notation). Thus, the only time function contributing to s(t) during this time is the y gradient, $G_y(t)$ Assuming that the constant value of $K_x(t)$ is $K_x(o)$, equation (4) can be rewritten in the following way:

$$s(t) = \int_{-L_y/2}^{L_y/2} B(y) e^{-j\pi K_y(t)y} \, dy \quad (5)$$

where $$B(y) = \int_{-L_x/2}^{L_x/2} f(x,y) e^{-j\pi K_x(o)} \, dx \quad (6)$$

Thus, s(t) for t>0 is the Fourier transform of the density function B(y). Unfortunately, the observed NMR signal, r(t), is contaminated with noise and is given by:

$$r(t) = s(t) + n(t) \quad (7)$$

where n(t) is assumed to be a white, Gaussian, zero mean random noise. The primary objective of the present invention is to optimally estimate equally spaced samples of B(y) given by:

$$B(y) = B\left(\frac{iL_y}{N}\right), 0 \leq i < N \quad (8)$$

by observing the noisy signal, r(t).

The y gradient is assumed to be sinusoidal and of the form:

$$G_y(t) = G \sin\left(\frac{\pi t}{T}\right), 0 < t < T \quad (9)$$

Substituting equation (9) into equation (3) yields:

$$K_y(t) = \frac{\gamma G T}{\pi}\left[1 - \cos\left(\frac{\pi t}{T}\right)\right] + K_y(o) \quad (10)$$

Note that experimentally $K_y(o)$ is chosen so as to center the spatial frequency range at zero. The proper initial condition can be found by setting $K_y(T/2)=0$ and solving equation (10). This yields the required initial conditions:

$$K_y(o) = \frac{-\gamma G T}{\pi} \quad (11)$$

Combining (10) and (11) and simplifying yields the final expression for $K_y(t)$;

$$K_y(t) = \frac{\gamma G T}{\pi} \cos\left(\frac{\pi t}{T}\right) \quad (12)$$

Substituting the above equation and equation (8) into equation (5), then into equation (7) and assuming that $$N = \frac{2\gamma G T L_y}{\pi} : \quad (13)$$

$$r(t) = n(t) + \frac{L_y}{N} \sum_{i=-\frac{N}{2}}^{\frac{N}{2}+1} B\left(\frac{iL_y}{N}\right) e^{-j\pi i \cos(\frac{\pi t}{T})}$$

The received signal r(t) must be low pass filtered in such a way that its "clean" NMR signal, s(t), is left unchanged. Specifically, the frequency response of the low pass filter 4 is given by:

$$H(f) = \begin{cases} 1 & |f| < W \\ 0 & \text{elsewhere} \end{cases} \quad (14)$$

The frequency response H(f) has a large enough bandwidth so that it leaves the "clean" NMR signal s(t) unchanged.

Due to the finite aperture time of the A/D converter, the nth observed value is $$\int_{\frac{Tm}{PN} - \Delta}^{\frac{Tm}{PN} + \Delta} r(t)dt = \int_{\frac{Tm}{PN} - \Delta}^{\frac{Tm}{PN} + \Delta} s(t)dt + \int_{\frac{Tm}{PN} - \Delta}^{\frac{Tm}{PN} + \Delta} n(t)dt \quad (15)$$

where PN is the total number of samples taken in time T and $\Delta$ is the A/D aperture time. From equation (13):

$$\int_{\frac{Tm}{PN} - \Delta}^{\frac{Tm}{PN} + \Delta} r(t)dt = \int_{\frac{Tm}{PN} - \Delta}^{\frac{Tm}{PN} + \Delta} n(t)dt + \int_{\frac{Tm}{PN} - \Delta}^{\frac{Tm}{PN} + \Delta} \frac{L_y}{N} \sum_{i=-\frac{N}{2}}^{\frac{N}{2}-1} B\left(\frac{iL_y}{N}\right) e^{-j\pi i \cos(\frac{\pi n}{PN})} \quad (16)$$

r(t) and n(t) in the above equation are the low pass version of r(t) and n(t) respectively. In addition, in the above equation, it is assumed that $\Delta$ is small enough so that the following approximation is valid:

$$\int_{\frac{Tm}{PN} - \Delta}^{\frac{Tm}{PN} + \Delta} \frac{L_y}{N} \sum_{i=-\frac{N}{2}}^{\frac{N}{2}-1} B\left(\frac{iL_y}{N}\right) e^{-j\pi i \cos(\frac{\pi n}{PN})} = \frac{L_y}{N} \sum_{i=-\frac{N}{2}}^{\frac{N}{2}-1} B\left(\frac{iL_y}{N}\right) 2\Delta e^{-j\pi i \cos(\frac{\pi n}{PN})} \quad (17)$$

Neglecting sealing factors $$\frac{2\Delta L_y}{N},$$

Equation (16) can be written in vector format for different values of m:

$$\begin{bmatrix} \int_{-\Delta}^{\Delta} r(t)dt \\ \int_{\frac{T}{PN} - \Delta}^{\frac{T}{PN} + \Delta} r(t)dt \\ \vdots \\ \int_{\frac{T(PN-1)}{PN} - \Delta}^{\frac{T(PN-1)}{PN} + \Delta} r(t)dt \end{bmatrix} = H \begin{bmatrix} B[L_y(-\frac{1}{2})] \\ B\left[L_y\left(-\frac{1}{2} + \frac{1}{N}\right)\right] \\ B(0) \\ \vdots \\ B\left[L_y\left(-\frac{1}{2} + \frac{(N-2)}{N}\right)\right] \\ B\left[L_y\left(-\frac{1}{2} + \frac{(N-1)}{N}\right)\right] \end{bmatrix} \begin{bmatrix} \int_{-\Delta}^{\Delta} n(t)dt \\ \int_{\frac{T}{PN} - \Delta}^{\frac{T}{PN} + \Delta} n(t)dt \\ \vdots \\ \int_{\frac{T(PN-1)}{PN} - \Delta}^{\frac{T(PN-1)}{PN} + \Delta} n(t)dt \end{bmatrix}$$

where H is a PN×N matrix whose mkth element is given by:

$$h_{mk} = e^{-j\pi(k - \frac{N}{2})\cos(\frac{\pi m}{PN})} \quad (19)$$

From equation (16), the linear least square estimator based on linear sample of r(t) is given by:

$$B = (H^*H)^{-1} H^* r \quad (20)$$

where H* denotes the complex conjugate transpose matrix of H.

Although the H matrix set forth above is based upon a sinusoidal readout gradient, it will become apparent to one of ordinary skill in the art that the method of the present invention can be used for readout gradients of other shapes, and that the specific H matrix for a specific waveform can be derived merely by following the steps of equations (9)–(13) above.

DIGITAL PROCESSING

The digital processing of the present invention can be divided into two steps. These are:
1. Table Set-Up Processing, in which the least square estimator matrix is computed and stored; and
2. Real-Time Processing, in which the acquired data is multiplied by the least squared estimator matrix.

The processing required for each of these steps is now described in detail, as well as some of the important considerations involved in their realization.

TABLE SET-UP PROCESSING

Figure 2:
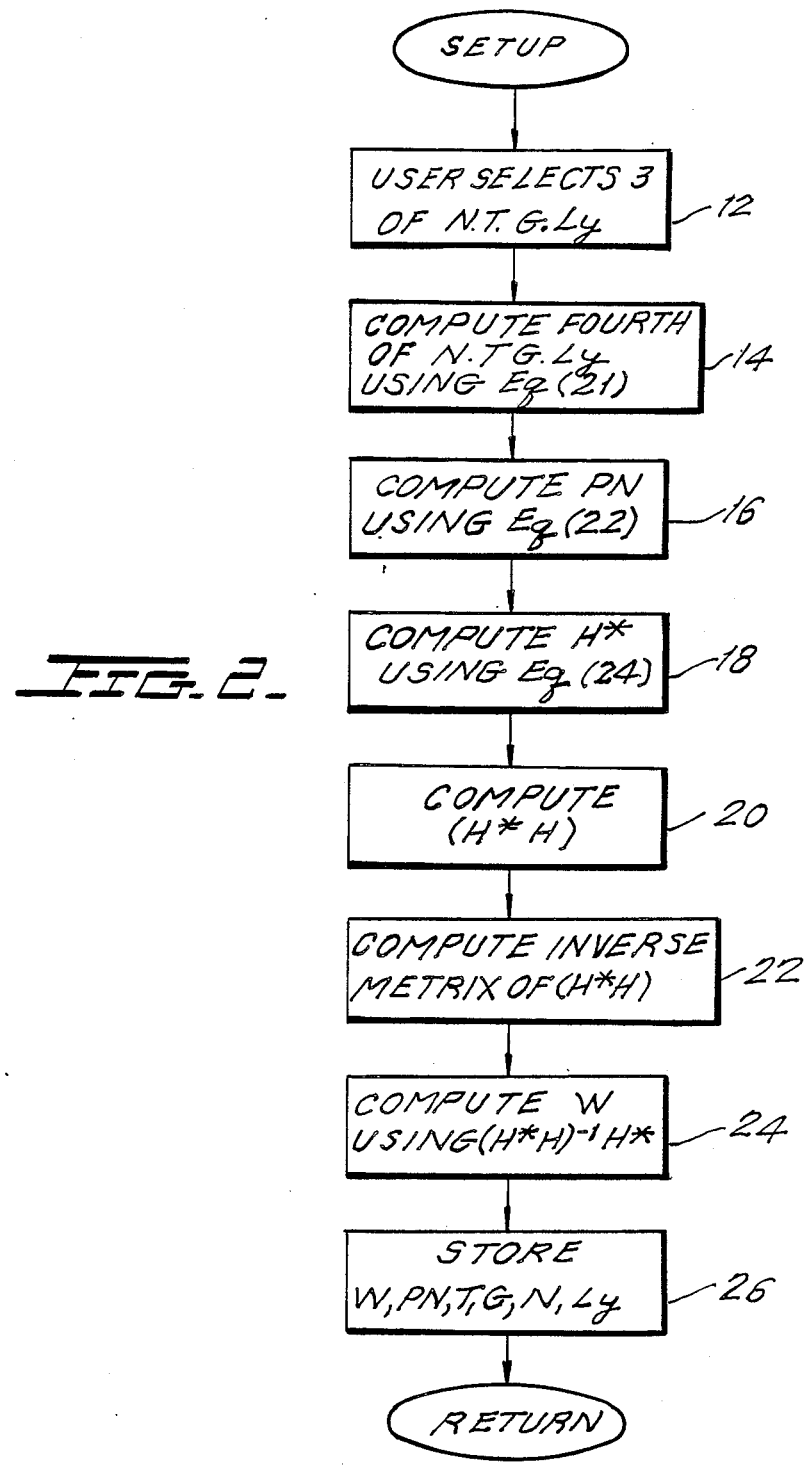
FIG. 2 is a block diagram of the table set-up processing.

Referring to FIG. 2, the user first selects any three of the following four parameters (step 12):

N = the number of spatial samples desired in the y direction;

T = the total time to sample one line in the y direction;

G = the field gradient strength;

$L_y$ = the total extent of the region to be imaged in the y direction;

Any time that one of these parameters changes, the Table Set-Up routine must be re-executed. Selecting any three of N, T, G, and $L_y$ fixes the fourth according to the relationship:

$$T = \frac{\pi N}{2\gamma G L_y} \quad (21)$$

Once three of these parameters are selected, the fourth is computed (step 14) using equation (21). Then, in step 16, the total number of samples required, PN, is calculated from the equation.

$$PN = 2WT \quad (22)$$

where W is the bandwidth in Hertz of low-pass filter 4 at the input to the data acquisition system.

Next, in step 18, the elements of the so-called H* matrix (the complex-conjugate transpose of the H matrix) are calculated using the following relationship:

$$h^*_{mk} = e^{j\pi(m - \frac{N}{2})\cos(\frac{\pi K}{PN})}$$

where $h^*_{mk}$ is $mk^{th}$ element of H*. Note that H* is a complex-valued matrix.

H* is a set of N vectors, each vector with PN elements. The following ranges apply:

$$0 \leq m \leq N - 1 \quad (23)$$

$$0 \leq k \leq PN - 1$$

One possible implementation of this calculation consists of repeated applications of a scientific subroutine, as set forth below.
1. Fill each of N real vectors with an integer ramp from 0 to PN-1 (VRAMP)
2. Multiply each vector by $\pi/PN$ (VSMUL).
3. Compute the cosine of each vector (VCOS).
4. Multiply each vector by $-1$ and then add 1 to the resultant vector (VSMSA).
5. Multiply the $m^{th}$ vector by $\pi m$, $0 \leq m \leq N-1$ (VSMUL).
6. For each of the N real vectors, create a complex vector with zero as the real part and the $m^{th}$ vector as the imaginary part (CVCOMB).
7. For each of the N complex vectors, compute the complex exponential (CVEXP).
8. Multiply each vector by $2\Delta + j0$ (CVCSML).

Then, in step 20, use $$h^*_{mk} = e^{j\pi(m - \frac{N}{2})\cos(\frac{\pi K}{PN})} \quad (24)$$

directly to make $(H^*H)_{mk}$ by matrix multiplication.

The next step (step 22) is to compute $(H^*H)^{-1}$.

H*H will in general be a large, real matrix with extent NXN (with N typically 128). Thus, a general inverse calculation will be slow (on the order of $N^3$ multiplications). However, the special structure of Z (a Toeplitz matrix) will, in most instances, enable more efficient inversions. That is, $$Z_{mk} = F(m - k)$$

where $Z_{mk}$ is the $mk^{th}$ element of Z. In addition, Z is symmetric, since $$Z_{mk} = Z_{km}$$

Next, the weighting vector (the least square estimator) is calculated in step 24 using the formula:

$$(H^*H)^{-1}H^*$$

This weighting vector is stored (step 26) and used as the weighting coefficients to estimate B from r in accordance with $b_i \Sigma_j w_{ij} r_j$, where $w_{ij}$ is the ijth element of the weight matrix $b_i$ is the output, and $r_j$ is the data.

REAL-TIME PROCESSING

Figure 3:
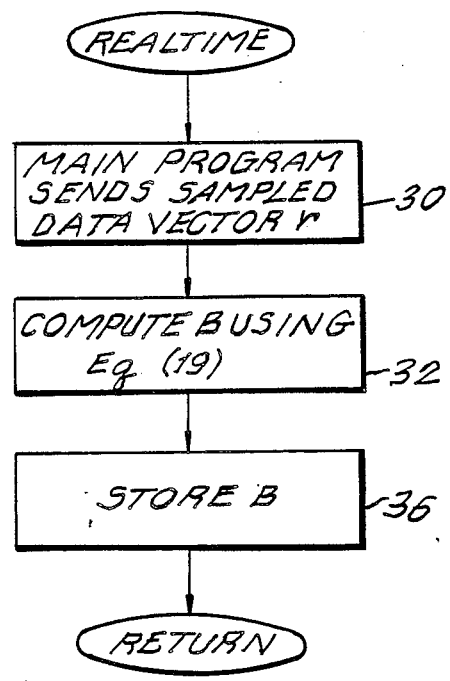
FIG. 3 is a block diagram of the real time least squares processing.

The real time processing, set forth in FIG. 3, consists of sampling a line, placing the samples of r(t) for that line in a vector r (step 30), and then applying the weighting matrix W (step 32), so that $$B = Wr$$

Since W is nxm complex and r m×1 real, this calculation would be quite slow using a standard MC scientific routine library function. If this is the case, a reduced multiplication can be implemented by investigating the geometry of W and only making those calculations that correspond to elements of W with significant contributions. This approach is termed a reduced length interpolation.

Although the present invention has been described in connection with a preferred embodiment thereof, many other variations and modifications will now become apparent to those skilled in the art without departing from the scope of the invention. It is preferred, therefore, that the present invention not be limited by the specific disclosure herein, but only by the appended claims.

What is claimed is:

1. A method for recovering MRI signals resulting from the application of time varying gradients, comprising the steps of:
    (a) demodulating the MRI signal;
    (b) low pass filtering the demodulated MRI signal of step (a);
    (c) converting the low pass filtered signal of step (b) into digital form by linearly sampling the signal with an A/D converter to fill up a vector r;
    (d) multiplying that vector r by a least squares estimator matrix $(H^*H)^{-1}H^*$, where H comprises a matrix based upon said time varying gradients; and
    (e) accumulating a plurality of vectors resulting from the multiplication performed in step (d) to form columns of a matrix, and performing a Fourier transformation on the rows of this matrix to obtain an MRI image.

2. The method of claim 1, wherein said time varying gradient comprises a sinusoidal gradient and the mkth element of said matrix H comprises:

$$h_{mk} = e^{-j\pi(k - \frac{N}{2})\cos(\frac{\pi m}{PN})}$$

where PN is the total number of samples taken in step (c).

3. The method of claim 2, wherein said A/D converter samples at the Nyquist rate of T/PN, the vector of step (d) has a dimension of PN×1, and the matrix H has dimensions PN×N.

4. The method of claim 1, wherein said low pass filter has a cut-off frequency W, where W is the highest frequency in the MRI signal which contains data concerning an object under study rather than noise.

* * * * *